United States Patent
Tokuda et al.

(10) Patent No.: US 10,522,735 B2
(45) Date of Patent: Dec. 31, 2019

(54) SURVEYING INSTRUMENT

(71) Applicant: TOPCON Corporation, Tokyo-to (JP)

(72) Inventors: Yoshihiko Tokuda, Tokyo-to (JP); Satoshi Nakamura, Tokyo-to (JP); Yosuke Okudaira, Tokyo-to (JP)

(73) Assignee: TOPCON Corporation, Tokyo-to (JP)

( * ) Notice: Subject to any disclaimer, the term of this patent is extended or adjusted under 35 U.S.C. 154(b) by 299 days.

(21) Appl. No.: 15/402,616

(22) Filed: Jan. 10, 2017

(65) Prior Publication Data

US 2017/0207384 A1 Jul. 20, 2017

(30) Foreign Application Priority Data

Jan. 18, 2016 (JP) .................................. 2016-007033

(51) Int. Cl.
| | | |
|---|---|---|
| *H01L 41/09* | (2006.01) | |
| *B06B 1/06* | (2006.01) | |
| *G01S 7/481* | (2006.01) | |
| *H01L 41/053* | (2006.01) | |
| *H01L 41/187* | (2006.01) | |

(52) U.S. Cl.
CPC .............. *H01L 41/09* (2013.01); *B06B 1/06* (2013.01); *G01S 7/481* (2013.01); *H01L 41/0533* (2013.01); *H01L 41/187* (2013.01)

(58) Field of Classification Search
CPC ...... H01L 41/09; H01L 41/0533; H02N 2/163
USPC ........................................ 310/323.01–323.21
See application file for complete search history.

(56) References Cited

U.S. PATENT DOCUMENTS

| | | |
|---|---|---|
| 5,475,930 A | 12/1995 | Kimura |
| 2001/0013740 A1 | 8/2001 | Fukui et al. |
| 2007/0057598 A1 | 3/2007 | Budinger et al. |
| 2010/0180456 A1 | 7/2010 | Laabs et al. |
| 2014/0196293 A1* | 7/2014 | Kodaira ............... G01C 15/002 33/227 |
| 2016/0145997 A1 | 5/2016 | Steenwyk et al. |

(Continued)

FOREIGN PATENT DOCUMENTS

| | | |
|---|---|---|
| EP | 2759801 A2 | 7/2014 |
| JP | 2-303378 A | 12/1990 |

(Continued)

OTHER PUBLICATIONS

Notice of allowance dated Nov. 15, 2017 in co-pending U.S. Appl. No. 15/402,626.

(Continued)

*Primary Examiner* — Derek J Rosenau
(74) *Attorney, Agent, or Firm* — Nields, Lemack & Frame, LLC

(57) ABSTRACT

The invention provides a surveying instrument, in which an output shaft of an ultrasonic motor is attachably and detachably connected by a bolt to a lower end of a horizontal shaft of a frame unit supported rotatably in a horizontal direction, a rotating plate is fixed to the output shaft, a vibration generating component is formed on an outer circumferential portion of the rotating plate, a stator in close contact with the vibration generating component via a predetermined friction torque T1 is rotatably provided on the output shaft, the stator is restricted on a rotation by a whirl-stop unit, ultrasonic vibration is generated in the vibration generating component and the output shaft is rotated.

9 Claims, 4 Drawing Sheets

(56) References Cited

U.S. PATENT DOCUMENTS

2016/0204335 A1 7/2016 Oshima et al.
2017/0203332 A1 7/2017 Tokuda et al.
2017/0205229 A1 7/2017 Tokuda et al.

FOREIGN PATENT DOCUMENTS

JP     11-311517 A   11/1999
JP   2003-199370 A    7/2003
JP   2014-137299 A    7/2014

OTHER PUBLICATIONS

European communication dated Apr. 25, 2017 in corresponding European patent application No. 17151866.5.

\* cited by examiner

SURVEYING INSTRUMENT

BACKGROUND OF THE INVENTION

The present invention relates to a surveying instrument including a horizontal rotation driving unit with high accuracy and a simple structure.

A surveying instrument, e.g., a total station has a telescope unit for sighting a measuring point. The telescope unit is supported by a frame unit rotatably in a vertical direction, and further, the frame unit is supported rotatably in a horizontal direction by a base unit. Further, the total station includes a motor for rotating the telescope unit and a motor for rotating the frame unit.

Conventionally, a used motor is an electric motor. An output shaft of the electric motor and a rotation shaft of a rotation unit are connected via a first gear provided on the output shaft and a second gear provided on the rotation shaft and meshed with the first gear. Thereby, a mechanism is configured so that a rotating force of the electric motor is transmitted to the rotation unit via the first gear and the second gear. Further, there is a backlash in meshing between the first gear and the second gear. Since the backlash affects a rotational accuracy and a rotation positioning accuracy, the backlash needs to be made as small as possible. Particularly in a surveying instrument, an accuracy of a rotation angle is required by a unit of seconds. Thus, a highly accurate gear is needed, and further, high assembling accuracy is also required. For this reason, a manufacturing cost is high. Further, the backlash becomes large due to an abrasion of the gear or the like, and the accuracy is lowered over time.

SUMMARY OF THE INVENTION

It is an object of the present invention to provide a surveying instrument, without an error caused by a backlash or the like and including a horizontal rotation driving unit with high accuracy and a simple structure.

To attain the object as described above, in a surveying instrument according to the present invention, an output shaft of an ultrasonic motor is attachably and detachably connected by a bolt to a lower end of a horizontal shaft of a frame unit supported rotatably in a horizontal direction, a rotating plate is fixed to the output shaft, a vibration generating component is formed on an outer circumferential portion of the rotating plate, a stator in close contact with the vibration generating component via a predetermined friction torque $T1$ is rotatably provided on the output shaft, the stator is restricted on a rotation by a whirl-stop unit, ultrasonic vibration is generated in the vibration generating component and the output shaft is rotated.

Further, in the surveying instrument according to the present invention, the stator has an intermediate fixed disk, a fixed disk and a friction sheet interposed between the intermediate fixed disk and the fixed disk, and a friction torque $T2$ generated between the intermediate fixed disk and the fixed disk is set smaller than the friction torque $T1$.

Further, in the surveying instrument according to the present invention, a connection flange is provided on a lower end of the horizontal shaft, an output flange is provided on an upper end of the output shaft, the output flange is fixed to the connection flange by the bolt inserted from below, and through holes for bolt insertion are drilled in the stator and the rotating plate.

Further, in the surveying instrument according to the present invention, holes for cable insertion are formed at a central portion of the horizontal shaft and the output shaft, a slip ring is provided on a lower end of the output shaft, a first connector and a second connector are attachably and detachably provided on the slip ring, a first cable for supplying power to the vibration generating component is connected to the first connector, a second cable connected to a power supply unit incorporated in the frame unit is connected to the second connector, and power is supplied to the vibration generating component via the second cable, the second connector, the first connector and the first cable.

Furthermore, in the surveying instrument according to the present invention, the whirl-stop unit has a joint holder provided on a fixed side and a connection element provided on the stator, the joint holder has a ball holder for pressing a metal ball by a compression spring in a circumferential direction to the connection element and a connection pin holding the connection element by the ball holder and provided spanning over the joint holder and capable of tilting and wherein the whirl-stop unit restricts a displacement of the connection element in a rotating direction and absorbs a displacement in a radial direction between the joint holder and the connection element by tilting of the connection pin.

According to the present invention, in the surveying instrument, an output shaft of an ultrasonic motor is attachably and detachably connected by a bolt to a lower end of a horizontal shaft of a frame unit supported rotatably in a horizontal direction, a rotating plate is fixed to the output shaft, a vibration generating component is formed on an outer circumferential portion of the rotating plate, a stator in close contact with the vibration generating component via a predetermined friction torque $T1$ is rotatably provided on the output shaft, the stator is restricted on a rotation by a whirl-stop unit, ultrasonic vibration is generated in the vibration generating component and the output shaft is rotated. As a result, the horizontal shaft and the output shaft are directly connected, there is not an error caused by a backlash or the like, an accuracy is improved, the ultrasonic motor can be assembled and separated by connection-detachment between the horizontal shaft and the output shaft, and disassembling/assembling performances and maintainability of the surveying instrument are improved.

DETAILED DESCRIPTION OF THE PREFERRED EMBODIMENT

A description will be given below on an embodiment of the present invention by referring to the attached drawings.

Figure 1:
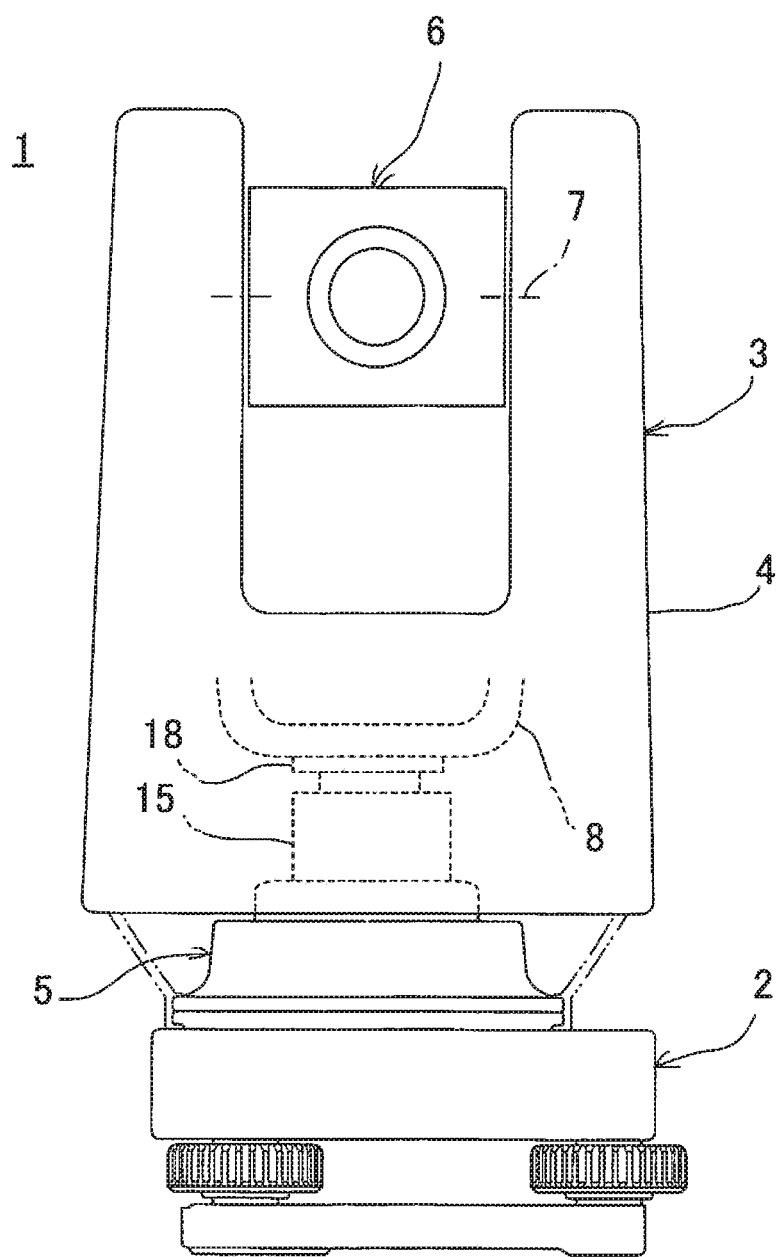
FIG. 1 is an entire view of a surveying instrument according to an embodiment of the present invention.

FIG. 1 is an entire view showing a surveying instrument 1 according to the present embodiment and in FIG. 1, reference numeral 2 denotes a leveling unit, and reference numeral 3 denotes a surveying instrument main body.

The surveying instrument main body 3 is installed on the leveling unit 2, and the surveying instrument main body 3 is configured to be leveled to a horizontal state by the leveling unit 2.

The surveying instrument main body 3 has a frame unit 4, a horizontal rotation driving unit 5 and a telescope unit 6. The horizontal rotation driving unit 5 is located on a lower end portion of the frame unit 4 and is mounted on the leveling unit 2 and supports the frame unit 4 capable of horizontal rotation.

On the frame unit 4, the telescope unit 6 is provided rotatably around a horizontal axis 7 as the center. The telescope unit 6 incorporates a distance measuring unit (not shown), and the distance measuring unit projects a modulated laser beam or a pulsed light as a distance measuring light toward an object to be measured (not shown), receives a reflected distance measuring light from the object to be measured and performs a distance measurement.

Further, a horizontal rotation angle of the frame unit 4 and a vertical rotation angle of the telescope unit 6 are detected by a horizontal angle encoder (not shown) and a vertical angle encoder (not shown), respectively.

Based on a distance measuring result, a horizontal angle as detected and a vertical angle as detected, three-dimensional data of a measuring point or an object to be measured is measured.

Figure 2:
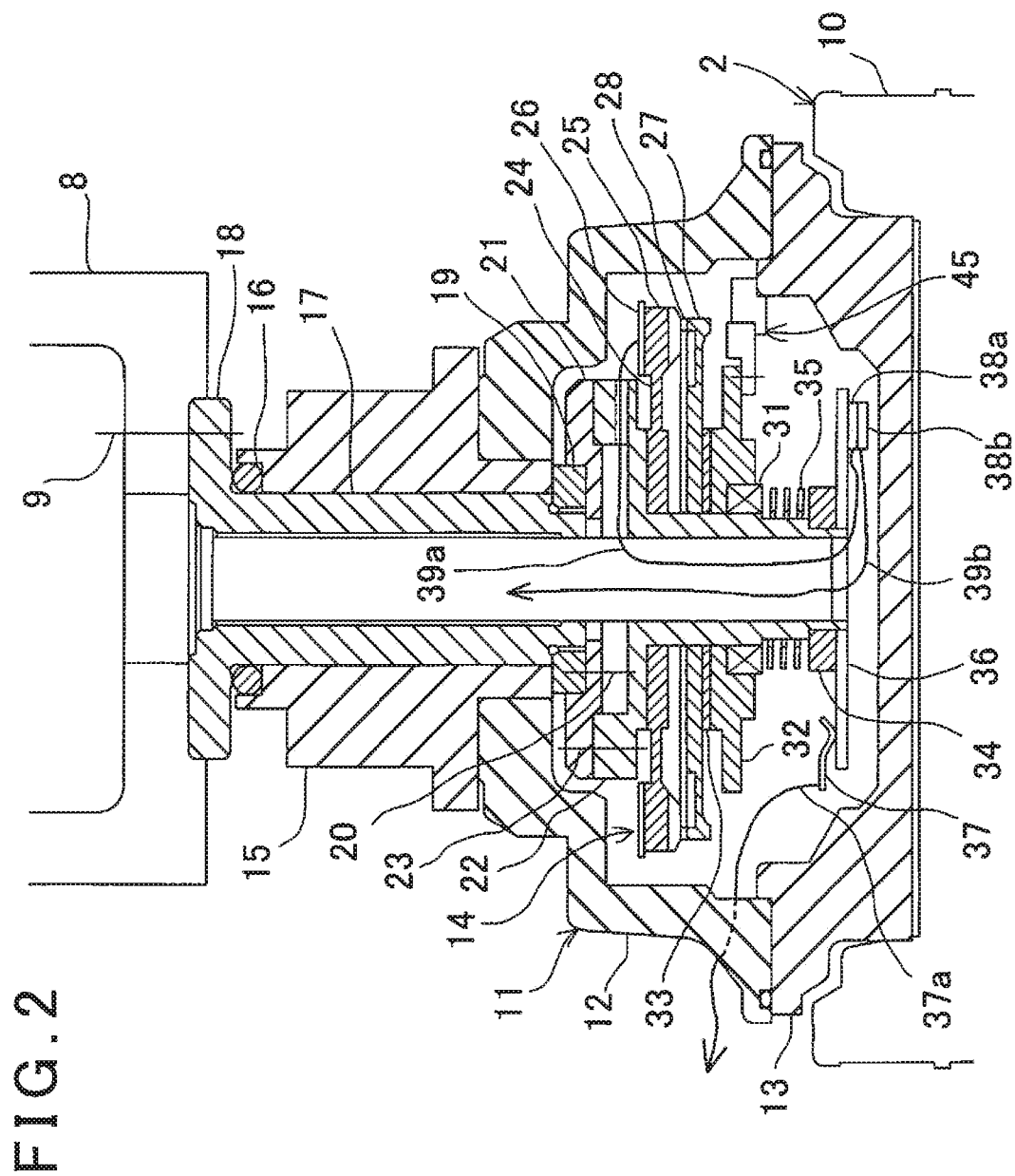
FIG. 2 is a cross-sectional view of a horizontal rotation driving unit of a surveying instrument according to the present embodiment.
Figure 3:
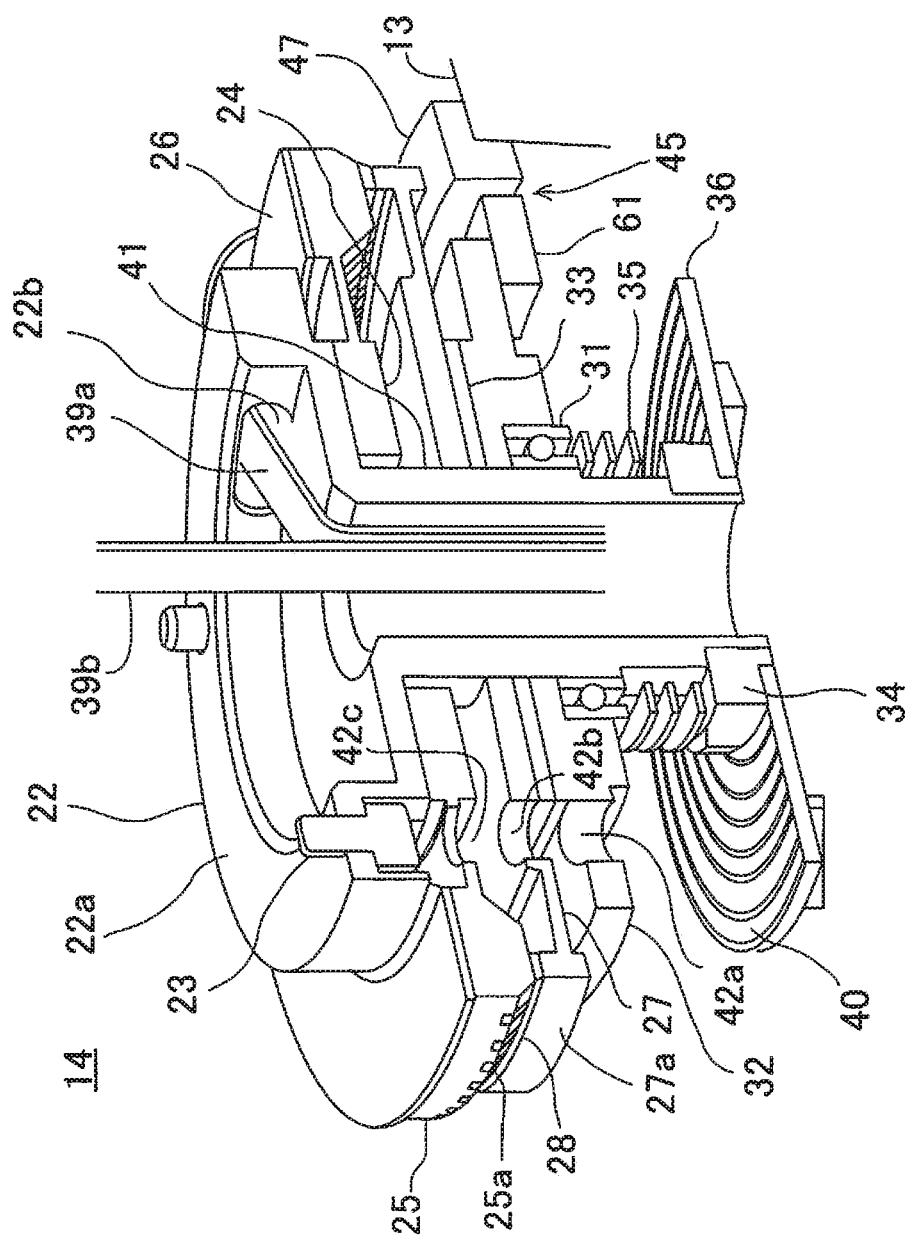
FIG. 3 is a cross-sectional perspective view of a horizontal motor included in the horizontal rotation driving unit.

Next, by referring to FIG. 2 and FIG. 3, a detailed description will be given on the horizontal rotation driving unit 5.

A motor casing 11 has a rigidity and strength as required and is liquid-tightly constituted by an upper case 12 and a lower case 13. Inside the motor casing 11, a horizontal motor (an ultrasonic motor) 14 by ultrasonic wave driving is accommodated. The lower case 13 is mounted on a base unit 10 of the leveling unit 2 in a spigot-joint method. Here, the motor casing 11 functions as a case for accommodating the horizontal motor 14 and also functions as a structural member for supporting the frame unit 4.

A bearing block 15 extending upward is provided on an upper surface of the upper case 12, and a horizontal shaft 17 penetrating up and down the bearing block 15 is rotatably provided. On an upper end of the horizontal shaft 17, a flange 18 is formed, and on the flange 18, a frame 8 of the frame unit 4 is fixed by a bolt 9.

Between the flange 18 and an upper end of the bearing block 15, a thrust bearing 16 is provided, and by means of the thrust bearing 16, a vertical load of the surveying instrument main body 3 is supported.

On a lower end of the horizontal shaft 17, a ring 19 is screwed up. The ring 19 is fixed to the horizontal shaft 17 so as to be rotated integrally with the horizontal shaft 17.

On the ring 19, a connection flange 21 is fixed from below by a bolt 20. Further, on the connection flange 21, the horizontal motor 14 is fixed by a bolt 23. Further, the horizontal motor 14 can be removed from the connection flange 21 (that is, the horizontal shaft 17) by removing the bolt 23.

By referring to FIG. 3, a further description will be given on the horizontal motor 14.

On an upper end of an output shaft 41 of the horizontal motor 14, an output flange 22 is formed. A peripheral edge portion 22a of the output flange 22 is thick, and the output flange 22 has a shape in which a recessed portion is formed at a center part. Further, at a position as required of the peripheral edge portion 22a, a hole penetrating in a radial direction or a groove is formed (in the figure, a hole 22b is indicated). On a lower surface of the output flange 22, a rotating plate 24 is fixed. A diameter of the rotating plate 24 is larger than the output flange 22, and on an outer circumferential portion of the rotating plate 24 extending from the output flange 22, a vibration generating component 25 with a ring shape is provided.

On a lower surface of the vibration generating component 25, comb teeth 25a are formed over a total circumference. On an upper surface of the vibration generating component 25, a piezoelectric ceramic (a piezoelectric element) 26 with a thin-plate ring shape is fixed in close contact concentrically with the rotating plate 24.

On a lower side of the rotating plate 24, an intermediate fixed disk 27 is provided. The intermediate fixed disk 27 is rotatably fitted with the output shaft 41 and the intermediate fixed disk 27 is capable of displacement in an axial direction. On an outer circumferential portion of the intermediate fixed disk 27, a ring-shaped rib 27a is formed, and the rib 27a is in close contact with an lower surface of the vibration generating component 25 via a first friction sheet 28.

A fixed disk 32 is rotatably fitted with the output shaft 41 via a bearing 31 and further, the fixed disk 32 is capable of displacement in an axial direction. Between the fixed disk 32 and the intermediate fixed disk 27, a second friction sheet 33 is interposed.

On the lower end portion of the output shaft 41, a fixing nut 34 is screwed up, and between the fixing nut 34 and the bearing 31, a compression spring 35 is provided. The compression spring 35 is provided in a compressed state so as to act a required pressing force between the vibration generating component 25 and the rib 27a and between the intermediate fixed disk 27 and the fixed disk 32.

Further, by the pressing force applied by the compression spring 35, a relationship between a friction torque T1, which is generated between the vibration generating component 25 and the intermediate fixed disk 27, and a friction torque T2, which is generated between the intermediate fixed disk 27 and the fixed disk 32, is T1>T2. Further, T2 is larger than a driving torque required for the horizontal motor 14 during a normal operation.

On the lower end of the output shaft 41, a slip ring 36 is mounted. A first connector 38a (see FIG. 2) is attachable to and detachable from the slip ring 36, and a second connector 38b (see FIG. 2) is attachable to and detachable from the slip ring 36. The first connector 38a and the second connector 38b can be connected/disconnected via the slip ring 36. It is to be noted that the first connector 38a and the second connector 38b may be capable of connecting or disconnecting directly.

To the first connector 38a, a first cable 39a is connected, and the first cable 39a is connected to the piezoelectric ceramic 26. Further, to the second connector 38b, a second cable 39b is connected, and the second cable 39b is connected to a power supply unit (not shown) included inside the frame unit 4.

The first cable 39a is wired to reach from the piezoelectric ceramic 26 through the hole 22b and a hole formed at a center of the output shaft 41 to the first connector 38a. The second cable 39b is wired to reach from the second connector 38b through a hole formed at a center of the output shaft 41 and a hole formed at a center of the horizontal shaft 17 to the power supply unit.

By supplying an electric power from the power supply unit to the vibration generating component 25, the comb teeth 25a are ultrasonically vibrated, and it is so arranged that a relative rotation is generated between the intermediate fixed disk 27 and the vibration generating component 25.

Further, between the intermediate fixed disk 27 and the fixed disk 32, a friction force acts, and the intermediate fixed disk 27 and the fixed disk 32 are rotatable with respect to the output shaft 41. Therefore, the intermediate fixed disk 27 and the fixed disk 32 are rotated integrally. Further, as described later, between the fixed disk 32 and the lower case 13 (that is to say, a fixing member), a whirl-stop unit 45 is provided, and a rotation of the fixed disk 32 is restricted.

Therefore, the intermediate fixed disk 27 and the fixed disk 32 function as a stator, and the output shaft 41 (that is, the output flange 22) functions as a rotor. By supplying power to the piezoelectric ceramic 26 and by controlling power supplying, the output flange 22 is rotated in a required direction at a required rotation speed.

Next, a description will be given on mounting of the horizontal motor 14 to the bolt 23.

As described above, the horizontal motor 14, in which the rotating plate 24, the intermediate fixed disk 27, the fixed disk 32 or the like are concentrically assembled to the output shaft 41, is constituted as a unit.

The output flange 22 has a function as an output end of the horizontal motor 14 and also has a function as a joint for connecting the horizontal motor 14 to the horizontal shaft 17.

In the output flange 22, a bolt hole for the bolt 23 is drilled. Further, a through hole 42*a* is drilled in the fixed disk 32, a through hole 42*b* is drilled in the intermediate fixed disk 27 and further a through hole 42*c* is drilled in the rotating plate 24, respectively. The through hole 42*a*, the through hole 42*b*, and the through hole 42*c* can be aligned on the same axis, and in a state aligned on the same axis, the bolt 23 can be inserted into a bolt hole from below through the through hole 42*a*, the through hole 42*b*, and the through hole 42*c* and further, the bolt 23 can be screwed to the connection flange 21.

That is to say, by the bolt 23, the horizontal motor 14 can be connected to the connection flange 21 (that is to say, the horizontal shaft 17).

The slip ring 36 is mounted on the output shaft 41 after the horizontal motor 14 is connected to the horizontal shaft 17. Further, the first connector 38*a* of the first cable 39*a* is connected to the slip ring 36 and the second cable 39*b* is connected to the second connector 38*b*.

Therefore, after individually assembling only the horizontal motor 14 and adjusting, the horizontal motor 14 can be assembled into the horizontal shaft 17, and the assembling and adjusting of the horizontal motor 14 can be carried out in parallel with assembling and adjusting of the surveying instrument main body 3. Further, it is possible to remove the horizontal motor 14 and to adjust individually.

On the slip ring 36, ring-shaped contacts 40 are formed concentrically and multiply, and to the contact 40, sliding contacts 37 are connected. To the sliding contacts 37, a cable 37*a* is connected, and it is so arranged that a communication with an outside and power supplying from the outside can be carried out via the sliding contact 37.

Figure 4:
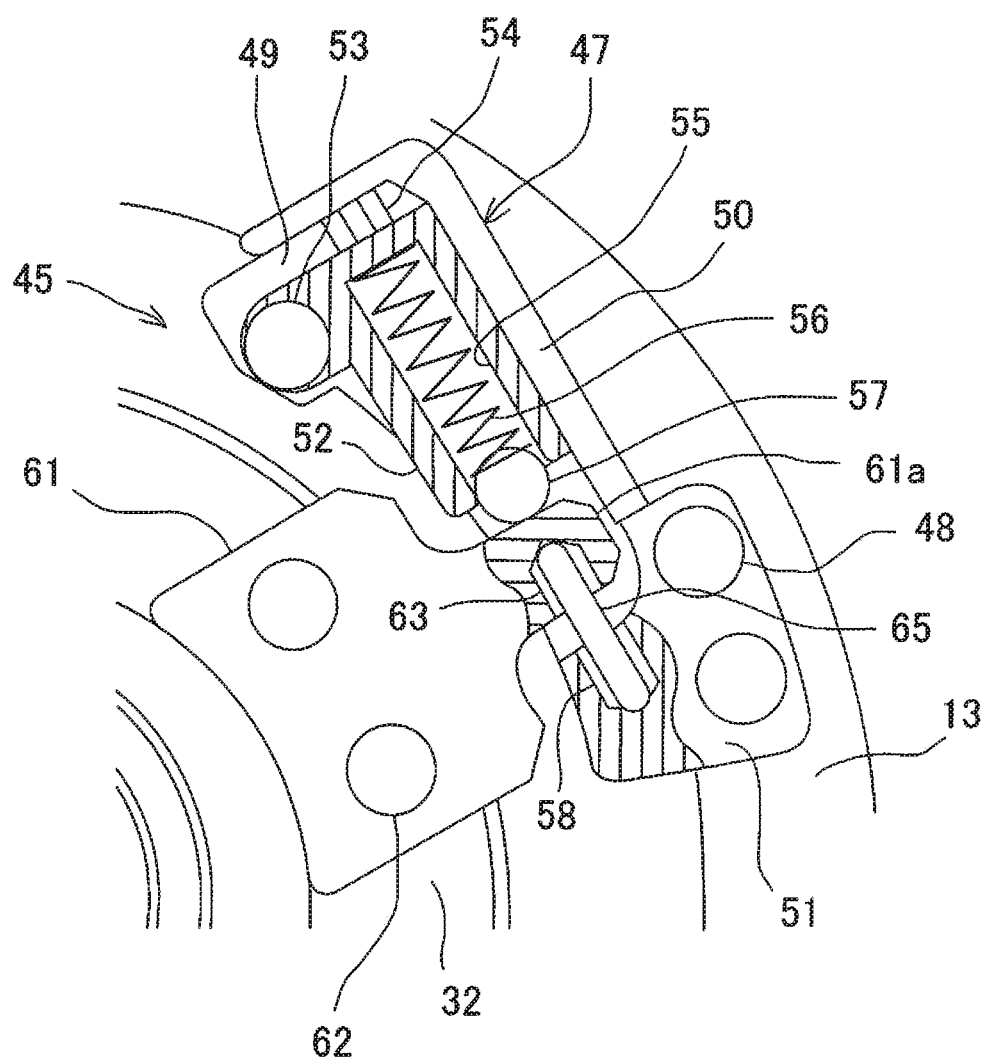
FIG. 4 is a partial cross-sectional view of a whirl-stop unit used in the horizontal motor.

Next, by referring to FIG. 4, a description will be given on the whir stop unit 45.

As described above, the horizontal motor 14 is mounted on the lower end of the horizontal shaft 17, and a relative rotation is possible between the output flange 22 and the intermediate fixed disk 27, the fixed disk 32. However, in order to obtain a rotating force from the output shaft 41, the intermediate fixed disk 27 and the fixed disk 32 needs to be fixed.

The whirl-stop unit 45 connects the fixed disk 32 and the lower case 13 to each other and restricts a rotation of the fixed disk 32.

The whirl-stop unit 45 has a joint holder 47 and the joint holder 47 is mounted on the lower case 13 by a bolt 48. The joint holder 47 is manufactured by machining, die-casting or the like and has a rigidity and a strength as required.

Further, on the joint holder 47, a recessed portion 49 extending in a tangential direction of the lower case 13 (a tangential direction of a circle around an axis of the output shaft 41 as the center) is formed. The recessed portion 49 is surrounded by a L-shaped brim portion 50 positioned on an outer circumferential side and a thick base portion 51 positioned on a base side (lower side in FIG. 4) of the recessed portion 49 in three sides, and a center side is open.

To the recessed portion 49, a ball holder 52 having an L-shaped outer shape is fixed by a bolt 53 at one spot. Further, the ball holder 52 is in contact with the brim portion 50. Further, the ball holder 52 is capable of positional adjustment by a pushing screw 5.

In the ball holder 52, a cylindrical hole 55 with an axis in a tangential direction is drilled, and in the cylindrical hole 55, a compression spring 56 is accommodated in a compressed state. Further, at a forward end of the compression spring 56, a metal bail or preferably a steel ball 57 is provided.

In the base portion 51, a pin accommodating hole 58 is drilled so as to be concentric with the cylindrical hole 55, and a hole bottom of the pin accommodating hole 58 is made to be a circular cone. In the pin accommodating hole 58, a connection pin 65 is inserted. Both ends of the connection pin 65 are formed a spherical shape.

A diameter of the pin accommodating hole 58 is larger than a diameter of the connection pin 65, and the connection pin 65 is capable of tilting around a base end as the center in a state where the base end is fitted with the circular cone.

To the fixed disk 32, a connection plate 61 is fixed by a bolt 62. The connection plate 61 is manufactured by machining, die-casting or the like and has a rigidity and a strength as required.

In the connection plate 61, a connection element 61*a* is provided to protrude at a forward end. The connection element 61*a* is inserted between the ball holder 52 and the base portion 51.

Further, in the connection element 61*a*, a pin receiving hole 63 is drilled so as to be concentric with the pin accommodating hole 58. A hole bottom of the pin receiving hole 63 is made to be a circular cone.

In the pin receiving hole 63, a forward end portion of the connection pin 65 is inserted, and the connection pin 65 is provided by spanning between the pin accommodating hole 58 and the pin receiving hole 63.

With a surface on a side opposite to the pin receiving hole 63 of the connection element 61*a*, the steel ball 57 comes into contact.

On a contact surface of the steel ball 57, a pressing force by the compression spring 56 acts in a tangential direction (a circumferential direction), and a pressing reaction force from the connection pin 65 acts on a hole bottom of the pin receiving hole 63. Further, by a reaction of the compression spring 56, the ball holder 52 is given a rotating force in a counterclockwise direction (in FIG. 4), and the ball holder 52 is brought into close contact with the brim portion 50 and an attitude is fixed.

Therefore, a position in a circumferential direction of the connection plate 61 is determined by the base portion 51 via the connection pin 65. Further, in a case where the connection plate 61 is displaced in a radial direction with respect to the joint holder 47, the steel ball 57 slides against the connection plate 61, and the connection pin 65 tilts, and a displacement of the connection plate 61 is absorbed.

Thus, the whirl-stop unit 45 restricts a rotation of the fixed disk 32 and moreover, if the output shaft 41 is eccentric with respect to the horizontal shaft 17, a rotational deviation caused by an eccentricity is absorbed.

A description will be given on a horizontal rotation driving by the horizontal motor 14.

When a voltage is applied to the piezoelectric ceramic 26, the comb teeth 25a are ultrasonically vibrated and a relative rotation generates between the intermediate fixed disk 27 and the rotating plate 24.

Since the intermediate fixed disk 27 is fixed to the lower case 13 via the fixed disk 32 and the whirl-stop unit 45, the output shaft 41, that is, the output flange 22 is rotated.

A rotating force of the output shaft 41 is transmitted to the horizontal shaft 17 via the output flange 22, and the frame unit 4 is horizontally rotated.

Even in a case where an error is generated by mounting of the output flange 22 to the connection flange 21 and the output shaft 41 becomes eccentric with respect to the horizontal shaft 17, as described above, the eccentricity is absorbed by the whirl-stop unit 45, and the eccentricity does not influence a rotation of the horizontal shaft 17. Further, even if the horizontal motor 14 itself has a run out, the error of the horizontal motor 14 itself does not influence a rotational accuracy of the horizontal shaft 17.

That is to say, according to the present embodiment, there is no need to carry out with high accuracy a mounting of the horizontal motor 14 to the horizontal shaft 17.

Further, since the horizontal motor 14 and the horizontal shaft 17 are directly connected to each other, a backlash or the like is not interposed in a power transmission path, power can be transmitted with high accuracy and a deterioration of accuracy over time does not occur.

Next, a description will be given on a case where an excessive load is generated in the output shaft 41 during driving of the horizontal motor 14, e.g., a case where the surveying instrument main body 3 interferes with a foreign object and rotation of the surveying instrument main body 3 is restricted. Since a friction torque 12 between the intermediate fixed disk 27 and the fixed disk 32 is set smaller than a friction torque T1 between the rotating plate 24 and the intermediate fixed disk 27, a slip is generated between the intermediate fixed disk 27 and the fixed disk 32, and only the intermediate fixed disk 27 is rotated. That is to say, the horizontal motor 14 itself has a safety function against an overload.

Therefore, such a situation that an excessive load is applied to the horizontal motor 14 and the horizontal motor 14 is damaged is prevented. It is to be noted that the fact that the surveying instrument main body 3 is restricted is detected by the horizontal angle encoder (not shown), and driving of the horizontal motor 14 is stopped.

Further, even if the surveying instrument 1 is in a halt state, a stop state of the surveying instrument main body 3 is maintained by a friction torque of the horizontal motor 14, and by giving a lager rotating force than the friction torque T2 between the intermediate fixed disk 27 and the fixed disk 32, the frame unit 4 can be rotated in a required direction.

Next, in a case where maintenance with respect to the horizontal motor 14 is carried out, after the lower case 13 is removed from the upper case 12, the second connector 38b and the first connector 38a are removed and the slip ring 36 is removed.

The through hole 42a, the through hole 42b and the through hole 42c are aligned on the same axis, and the bolt 23 is removed from the connection flange 21.

Since the horizontal motor 14 is fixed to the connection flange 21 only by the bolt 23, the horizontal motor 14 can be removed integrally. Therefore, a removal and an assembling are easy and a maintainability is excellent.

It is to be noted that, in a case where there is a space above the upper case 12, a hole or a window for bolt insertion is formed in the upper case 12, and the connection flange 21 and the output flange 22 may be fixed from above by a bolt. Further, in the present embodiment, the connection flange 21 and the horizontal shaft 17 are provided separately but the connection flange 21 may be formed integrally on a lower end of the horizontal shaft 17.

Further, in the embodiment as described above, the horizontal motor 14 is provided on a lower end of a rotation shaft (the horizontal shaft 17), but it is needless to say that the horizontal motor 14 can be similarly provided on an upper end.

The invention claimed is:

1. A surveying instrument, wherein an output shaft of an ultrasonic motor is attachably and detachably connected by a bolt to a lower end of a horizontal shaft of a frame unit supported rotatably in a horizontal direction, a rotating plate is fixed to said output shaft, a vibration generating component is formed on an outer circumferential portion of said rotating plate, a stator in close contact with said vibration generating component via a predetermined friction torque T1 is rotatably provided on said output shaft, said stator is restricted on a rotation by a whirl-stop unit which absorbs an eccentricity, ultrasonic vibration is generated in said vibration generating component and said output shaft is rotated, and wherein said whirl-stop unit has a joint holder provided on a fixed side and a connection element provided on said stator, said joint holder has a ball holder for pressing a metal ball by a compression spring in a circumferential direction to said connection element and a connection pin holding said connection element by said ball holder and provided spanning over said joint holder and capable of tilting and wherein said whirl-stop unit restricts a displacement of said connection element in a rotating direction and absorbs a displacement in a radial direction between said joint holder and said connection element by tilting of said connection pin.

2. The surveying instrument according to claim 1, wherein said stator has an intermediate fixed disk, a fixed disk and a friction sheet interposed between said intermediate fixed disk and said fixed disk, and a friction torque T2 generated between said intermediate fixed disk and said fixed disk is set smaller than said friction torque T1.

3. The surveying instrument according to claim 1, wherein a connection flange is provided on a lower end of said horizontal shaft, an output flange is provided on an upper end of said output shaft, said output flange is fixed to said connection flange by said bolt inserted from below, and through holes for bolt insertion are drilled in said stator and said rotating plate.

4. The surveying instrument according to claim 1, wherein holes for cable insertion are formed at a central portion of said horizontal shaft and said output shaft, a slip ring is provided on a lower end of said output shaft, a first connector and a second connector are attachably and detachably provided on said slip ring, a first cable for supplying power to said vibration generating component is connected to said first connector, a second cable connected to a power supply unit incorporated in said frame unit is connected to said second connector, and power is supplied to said vibration generating component via said second cable, said second connector, said first connector and said first cable.

5. The surveying instrument according to claim 2, wherein a connection flange is provided on a lower end of said horizontal shaft, an output flange is provided on an upper end of said output shaft, said output flange is fixed to said connection flange by said bolt inserted from below, and through holes for bolt insertion are drilled in said stator and said rotating plate.

6. A surveying instrument, wherein an output shaft of an ultrasonic motor is attachably and detachably connected by a bolt to a lower end of a horizontal shaft of a frame unit supported rotatably in a horizontal direction, a rotating plate is fixed to said output shaft, a vibration generating component is formed on an outer circumferential portion of said rotating plate, a stator in close contact with said vibration generating component via a predetermined friction torque T1 is rotatably provided on said output shaft, said stator is restricted on a rotation by a whirl-stop unit which absorbs an eccentricity, ultrasonic vibration is generated in said vibration generating component and said output shaft is rotated, and wherein holes for cable insertion are formed at a central portion of said horizontal shaft and said output shaft, a slip ring is provided on a lower end of said output shaft, a first connector and a second connector are attachably and detachably provided on said slip ring, a first cable for supplying power to said vibration generating component is connected to said first connector, a second cable connected to a power supply unit incorporated in said frame unit is connected to said second connector, and power is supplied to said vibration generating component via said second cable, said second connector, said first connector and said first cable.

7. The surveying instrument according to claim 6, wherein said stator has an intermediate fixed disk, a fixed disk and a friction sheet interposed between said intermediate fixed disk and said fixed disk, and a friction torque T2 generated between said intermediate fixed disk and said fixed disk is set smaller than said friction torque T1.

8. The surveying instrument according to claim 6, wherein a connection flange is provided on a lower end of said horizontal shaft, an output flange is provided on an upper end of said output shaft, said output flange is fixed to said connection flange by said bolt inserted from below, and through holes for bolt insertion are drilled in said stator and said rotating plate.

9. The surveying instrument according to claim 7, wherein a connection flange is provided on a lower end of said horizontal shaft, an output flange is provided on an upper end of said output shaft, said output flange is fixed to said connection flange by said bolt inserted from below, and through holes for bolt insertion are drilled in said stator and said rotating plate.

* * * * *